United States Patent [19]

Nelson

[11] Patent Number: 4,683,456
[45] Date of Patent: Jul. 28, 1987

[54] METHODS AND APPARATUS FOR ANALOG TO DIGITAL CONVERSION

[75] Inventor: Robert G. Nelson, Dallas, Tex.
[73] Assignee: Timeback Systems, Inc., Dallas, Tex.
[21] Appl. No.: 566,314
[22] Filed: Dec. 28, 1983
[51] Int. Cl.$^4$ ................. A03K 13/20; G01P 15/08
[52] U.S. Cl. ................. 340/347 AD; 73/517 AV
[58] Field of Search ................. 340/347 AD, 347 NT; 73/517 AV

[56] References Cited

U.S. PATENT DOCUMENTS

| | | | |
|---|---|---|---|
| 3,274,497 | 9/1966 | Zimmerman | 340/347 AD |
| 3,623,072 | 11/1971 | Pohlman | 340/347 AD |
| 3,896,299 | 7/1975 | Rhodes | 340/347 AD |
| 4,057,796 | 11/1977 | Hoogendorn | 340/347 AD |

FOREIGN PATENT DOCUMENTS 1938597  2/1971  Fed. Rep. of Germany .

*Primary Examiner*—Bernard Roskoski
*Attorney, Agent, or Firm*—Kanz, Scherback & Timmons

[57] ABSTRACT

Methods and apparatus are described for generating a digital representation of an analog condition. In one method high-frequency digital signals are generated with the frequency of each signal being constant and the frequencies bearing a harmonic relationship one to the other. A representation of the analog condition is applied to cause a shift in phase in at least one of the digital signals. The digital signals are then compared to obtain a measure of the phase shift which is utilized to adjust the phase of the phase shifted signal toward its original phase condition. As a result of the measure of phase shift, there is generated a single weighed digital function which is representative of the amplitude of the adjustment utilized to return the phase shifted signal toward its original phase shifted condition. The single weighed digital function is applied to a low-pass digital filter to produce a multi-bit digital word representative of the instantaneous value of the analog condition.

Apparatus of invention comprises a pair of oscillators whose frequencies are constant, harmonically related to one another and whose outputs are time spaced digital pulses. An analog condition responsive means has applied thereto the aforesaid pulses to effect a relative phase shift between the digital pulses and a phase comparator measures the relative phase shift. Means are provided responsive to the measure of the relative phase shift to return the digital pulses toward an in-phase relationship, and in so doing, there is produced a single weighed digital function representative of the measure of the relative phase shift.

A new and improved geophone is described.

49 Claims, 10 Drawing Figures

TRAILING EDGE OF PULSE AT SUMMING JUNCTION-24

METHODS AND APPARATUS FOR ANALOG TO DIGITAL CONVERSION

BACKGROUND OF THE INVENTION

1. Field of the Invention

This invention relates generally to novel methods and apparatus for analog to digital conversion and more specifically to methods of digitizing variables by utilizing digitized time feedback and to systems utilizing the methods.

2. Description of Prior Art

Conditions which can be measured, (e.g., temperature, voltage, pressure, weight, distance, velocity, capacitance, etc.), are often digitized so that the measure can be expressed as discrete steps or digits. The first step in digitizing often includes the use of a transducer, a device that will convert energy from one form to another. For example, a piezoelectric crystal can be used to convert pressure variations into an analog voltage and a thermistor can be used to generate an analog voltage as a function of temperature. These voltages can then be digitized by an analog-to-digital converter. Other transducers, however, can more directly generate a digital output. For example, an interferometer can convert a displacement into a changing optical interference pattern that can then be converted into a pulsing, and hence digital, voltage by a photocell.

A popular form of analog-to-digital converter utilizes a ladder of matched resistors to divide either the input voltage or a reference voltage into a series of levels and arrive at a digitized or quantized representation of that voltage. When used in these devices, feedback is in the form of a voltage.

Voltage-to-frequency converters have a frequency output which is continuously variable. To be more useful, this output can be counted by a binary counter gated by a fixed clock or the output can be used to gate a fixed clock being used to drive a counter. Voltage-to-time converters, such as integrators, can be used in a similar manner as a substitute for the voltage-to-frequency converters.

A third form of converter is the delta-modulator which generates a single weighed digital pulse train with the polarity of the pulses dependent on a difference signal. This difference signal is created by subtracting the input voltage from a feedback voltage. The feedback voltage is generated by either a charge dispensing circuit or a digital-to-analog converter.

SUMMARY OF THE INVENTION

In accordance with the present invention, there is provided a method for generating a digital representation of an analog condition in which two high-frequency digital signals are generated with the frequency of each signal being constant and the frequencies bearing a harmonic relationship one to the other. A representation of the analog condition is applied to cause a shift in phase in at least one of the digital signals. The digital signals are then compared to obtain a measure of the phase shift which is utilized to adjust the phase of the phase shifted signal toward its original phase condition. As a result of the measure of phase shift, there is generated a single weighed digital function which is representative of the amplitude of the adjustment utilized to return the phase shifted signal toward its original phase shifted condition. The single weighed digital function may be applied to a low-pass digital filter to produce a multi-bit digital word representative of the instantaneous value of the analog condition.

In another embodiment of the invention, the analog condition is applied to effect a shift in phase of both digital signals, and the measure of phase shift is utilized to introduce a delay in one of the phase shifted signals which is in advance of the other.

A system employing the method of the present invention, in and of itself being an improvement over the prior art, comprises a pair of oscillators whose frequencies are constant, harmonically related to one another and whose outputs are time spaced digital pulses. An analog condition responsive means has applied thereto the aforesaid pulses to effect a relative phase shift between the digital pulses and a phase comparator measures the relative phase shift. Means are provided responsive to the measure of the relative phase shift to return the digital pulses toward an in-phase relationship, and in so doing, there is produced a single weighed digital function representative of the measure of the relative phase shift. Means are then provided for recording the single weighed digital function as a multibit binary word.

Another feature of the present invention is apparatus for introducing the phase shift to a digital pulse with the phase shift being proportional to a value of an external analog condition. The apparatus includes a housing with a mass of fixed dimension mounted within the housing and the housing and the mass being movable relative to one another in response to the external condition. An input is provided for receiving digital pulses and means within the housing responds to the appearance of the digital pulses at the input for introducing a phase shift in the digital signals proportional to the relative positions between the housing and the mass.

In accordance with the present invention, the aforesaid apparatus can take the form of a direct digital geophone comprising a casing and a spring mounted element or mass within the casing responsive to earth movement. The spring mounted element or mass has opposite faces with a transducer element mounted on one of the faces for movement with the spring mounted element. A mating transducer element is mounted on an opposed inside surface of the casing. The transducer element and the mating transducer element form a transducer assembly which is responsive to movement of the spring mounted element to produce signals representative of the instantaneous position of the spring mounted relative to the casing. In a specific embodiment, the transducer elements comprise a high frequency acoustic transmitter and a high frequency acoustic receiver.

A system embodying the present invention includes two oscillators, a phase comparator, a variable delay element related to the variables to be digitized, a circuit to cause discrete phase shifts, and control circuitry. From each cycle of the oscillators, the phase comparator determines which oscillator is leading. The external variable affects the variable delay and thus the oscillators' phase relationship. The control circuitry utilizes the phase comparator's output to control the discrete phase shifting circuit to bring the two oscillators back toward an in-phase relationship. The phase adjustments made with the discrete phase shifting circuit are encoded in a single weighed digital pulse train which may be applied to a digital low-pass filter to generate a multiple-bit binary word at a lower data rate, or it can be processed by an analog low-pass filter to construct an analog representation of the original variable. In a preferred method for implementing the invention, one or both of the aforesaid oscillators are implemented by way of a loop comprised of one or more delays cascaded together to provide a path and regeneration for one or more energy events continuously circulating in the loop. The energy event can be an electrical transition or pulse, an acoustic pulse, or an optical pulse. The combination of the energy events and the loop which recirculates and sustains the energy events constitutes an oscillator. When two energy events are recirculating in one loop, two oscillators coexist within that one loop as long as the energy events are separated in phase around the loop. A circuit is utilized to cause discrete phase shifts to one or both of the oscillators to cancel out the variable caused phase shifts as seen by the phase comparator. These discrete phase corrections occur once every loop or oscillator cycle so that the oscillators, as seen by the phase comparator, stay less than two discrete phase shifts of each other.

The advantages of the present invention can be understood from the following description of several techniques of practicing the invention described in conjunction with the following drawings.

DETAILED DESCRIPTION

Time Interval Digitizer

Figure 1:
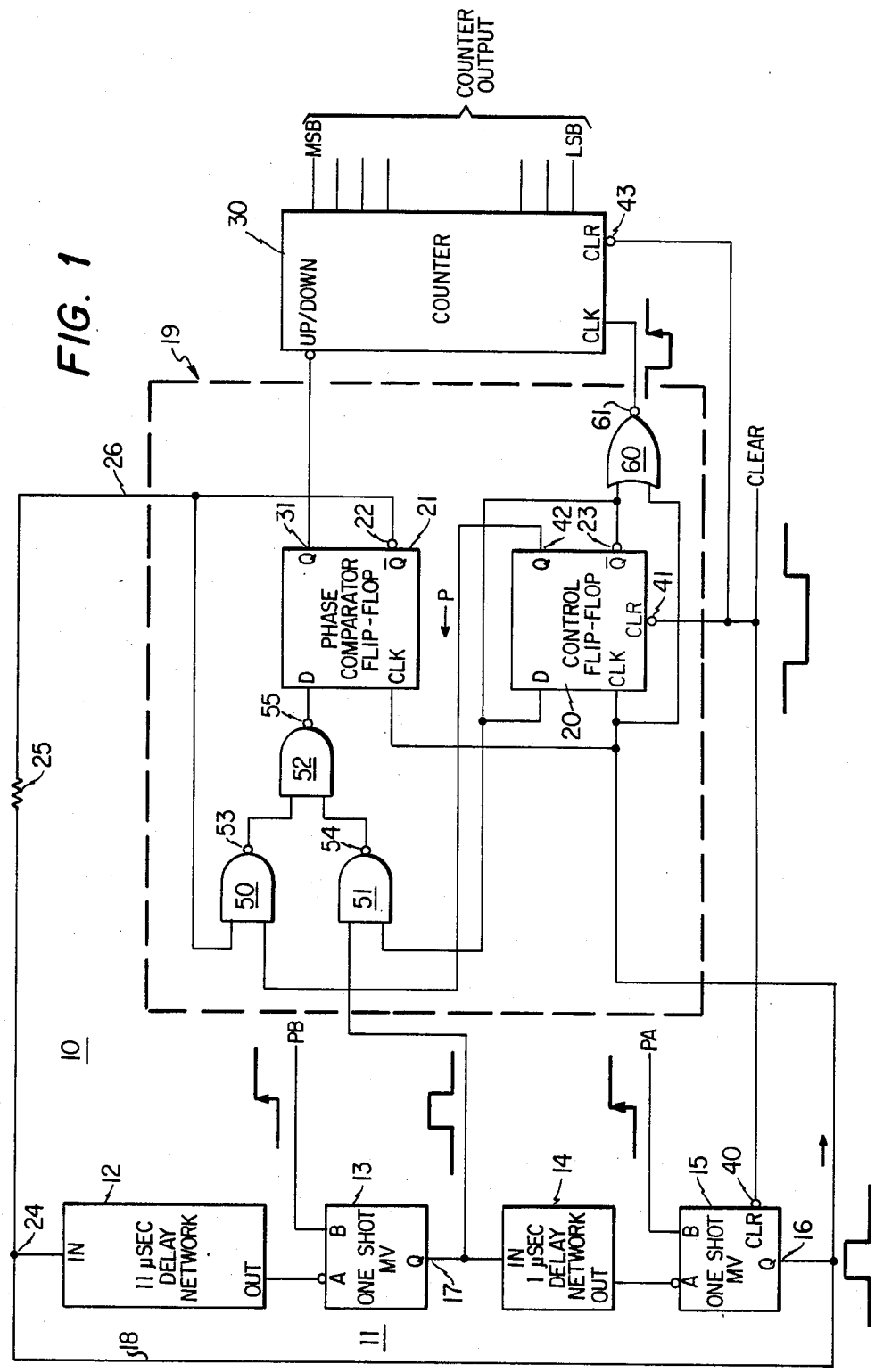
FIG. 1 is a schematic diagram of a time interval digitizer embodying features of the present invention.

FIG. 1 is a schematic representation of a time interval digitizer 10 embodying features of the present invention. A time interval digitizer is useful in quantizing the time separation between two external events such as the time occurrence of a pulse and the arrival of the pulse at a receiving station. Common with all species and representations of the invention is the presence of two oscillators which generate two high-frequency digital signals. The frequency of each signal is constant and the frequencies are harmonically related one to the other. In the embodiment of FIG. 1, the frequencies are equal. Due to the effects of an analog condition, a phase shift will occur or exist as between the high-frequency digital signals. The phase shift is determined by comparing the signals to obtain a measure of that phase shift, and the measure of phase shift is utilized to adjust the phase of one of the signals to bring it toward an in-phase relationship with the other signal. The phase shifts are discrete and represent an adjustment being made in the return of one signal toward an in-phase relationship with the other signal. From the adjustment being made, there is produced a single weighed digital function which represents the amplitude of the adjustment necessary to bring the two signals toward an in-phase relationship and thus representative of the time difference or phase difference that existed prior to the phase adjustment.

In FIG. 1, the two oscillators are provided by a loop 11 which includes four delay elements, the delay networks 12 and 14 and the active delay elements 13 and 15 which are in the illustrated embodiment comprised of one-shot multivibrators. Now upon the application of a pulse PA to the B input of the one-shot multivibrator 15, there will be produced at the output 16 of the multivibrator a short duration pulse which will circulate by way of conductor 18 and summing junction 24 to an input of the delay network 12 and thence to the inverted input A of the multivibrator 13. The multivibrator is triggered to reproduce pulse PA which proceeds through the delay network 14, and thence to the inverted input A of the multivibrator 15. The multivibrator is triggered to reproduce pulse PA at its Q output 16. It is apparent that the initial pulse PA will now effectively continue to circulate in the loop 11 indefinitely and thus constitutes in every respect a first oscillator.

Upon the injection of a second pulse PB to the B input of the one-shot multivibrator 13, a representation of the onset of the pulse PB will continuously circulate or propagate in the loop 11 in a manner similar to the above-described propagation of pulse PA and thus in every respect will constitute a second oscillator. The two pulses PA and PB will continue to propagate or circulate around the loop in spaced time relation and maintain their original phase relationship absent any outside effects.

The delay networks 12 and 14 can be any of a variety of pulse delay networks known in the art such as lengths of cable, cascaded one-shot multivibrators or cascaded inductor-capacitor networks, or combinations thereof. In the species of FIG. 1, the delay network 12 induces a delay of 11 microseconds and the delay network 14 introduces a delay of one microsecond. The two one-shot multivibrators 13 and 15 each generate a pulse and provide a delay of 0.25 microseconds. Accordingly, in this specific embodiment the total time for each of the pulses to travel around the loop is 12.5 microseconds. It will be understood that the foregoing time delays are merely given as exemplary values, and that other values may be utilized in the practice of the present invention.

In the example given, there is to be determined the time separation between the appearance of the pulses PA and PB at their reference points. The reference point for the pulse PA is the Q output 16 of the multivibrator 15. The reference point for the pulse PB is the Q output 17 of the multivibrator 13. With the above-described values of the delay networks and the pulse duration of the one-shot multivibrators, the occurrence of pulse PB is constrained to occur at the same time or within ten microseconds after the occurrence of PA.

Figure 1A:
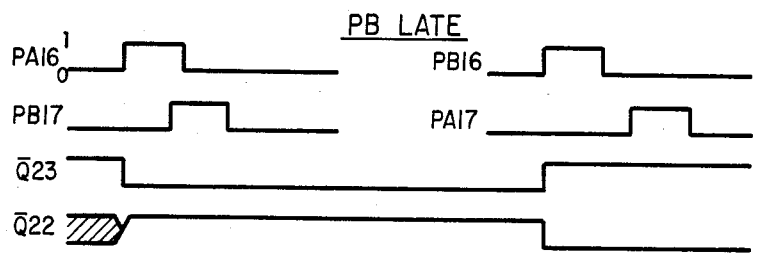
FIGS. 1A and 1B are waveform timing diagrams helpful in understanding of the general operation of the embodiment of FIG. 1.

The positive going edge of pulse PA triggers the one-shot multivibrator 15 which generates a 0.25 microsecond positive pulse at its Q output 16 illustrated as PA 16 in FIG. 1A. This pulse now propagates through the delay network 12 for 11 microseconds and the negative going edge of its output triggers the one-shot multivibrator 13. The one-shot multivibrator 13 generates a 0.25 microsecond positive pulse at its output 17 which then propagates through the delay network 14 for one microsecond. The negative going edge of the pulse now triggers the one-shot multivibrator 15 to generate another 0.25 microsecond pulse which will again propagate through the delay network 12 as above described. Thus, after being inserted into the loop, pulse PA or its equivalent propagates around the loop every 12.5 microseconds. This pulse PA circulating around the loop is equivalent to one oscillator.

The second event represented by the occurrence of pulse PB occurs at the same time as or within 10 microseconds after the time occurrence of the pulse PA. The positive going edge of the pulse PB triggers the one-shot multivibrator 13 to generate a 0.25 microsecond pulse at its Q output 17. The time occurrence of this pulse is illustrated in FIG. 1A as the pulse PB 17. The pulse now propagates through the delay network 14 and continues to propagate around the same loop in the same manner as pulse PA. The pulse PB circulating around the loop is equivalent to the second oscillator. It will be noted that pulse PB was introduced into the loop before the pulse PA had time to propagate to the one-shot multivibrator 13 for the first time. Thus, pulses PA and PB propagate similarly around the loop except that they are displaced in phase or time.

The time occurrence of the pulses at the output 17 of the one-shot multivibrator 13 and at the output 16 of the one-shot multivibrator 15 will be effective in controlling the operation of the control 20 and a phase comparator 21, included in logic network 19, so as to determine the logic level of the $\overline{Q}$ output 22 of the phase comparator 21. The control 20 and the phase comparator 21 are flipflops. The logic at the $\overline{Q}$ output 22 is applied by way of conductor 26 and high impedance 25 to the summing junction 24 selectively to introduce delays in the leading one of the pulses PA or PB and such delays will continue in discrete fashion until the pulses are returned toward an in-phase relationship to within about one discrete phase delay of one another as seen by the logic network 19.

As illustrated in FIG. 1A, the pulse PA 16 leads the pulse PB 17 in accordance with the preliminary or initial conditions established for description of the logic operation of the system. The logic level at the $\overline{Q}$ output 23 of the control 20 drops to a 0 logic level upon the occurrence of the pulse PA 16 while the logic level, previously unknown, at the $\overline{Q}$ output 22 of the phase comparator (shown as the shaded area) rises to the 1 logic level. At the 1 logic level, there will be a delay introduced to the pulse PA at the summing junction 24 by modifying the trailing edge of the pulse PA. Now upon the occurrence of the pulse PB at the output 16 of the one-shot multivibrator 15, the $\overline{Q}$ output at 23 of the control 20 will rise to the 1 logic level and cause the logic level at the $\overline{Q}$ output 22 of the phase comparator 21 to fall to a 0 logic level whereupon the pulse PB upon its arrival at the summing junction 24 will be unaffected or otherwise stated, there will be no delay introduced to the pulse PB. The operation will continue until both pulses are effectively brought into phase, that is when the pulse PA and PB appear at the same time or within one discrete phase delay at their respective reference points in the loop 11.

Each time the phase comparator output $\overline{Q}$ at 22 rises to a 1 logic level representing a discrete delay applied to pulse PA, the counter 30 is triggered to count that occurrence of the 1 logic level. The counter will stop counting when the pulses are in phase. The output of the counter will be representative of the number of discrete time delays introduced in order to bring the pulses back into phase and therefore also representative of the initial phase difference or time difference as between the occurrence of pulses PA and PB.

When the system introduces sufficient increments of delay to the pulse PA to bring the pulse PA and PB to within one delay increment, the system will then continue to introduce an incremental delay to pulse PA such that pulse PB will now lead. In this sense, the system will overcompensate but then begin to hunt or "toggle" back and forth producing in accordance with the logic circuitry alternate logic 1's and logic 0's to the counter 30, causing the counter to count up and down and thus effectively maintaining a readout representative of the initial time difference between the occurrence of the pulses PA and PB. In this foregoing situation where the pulse PB now leads pulse PA, the following operation of the system takes place.

Figure 1B:
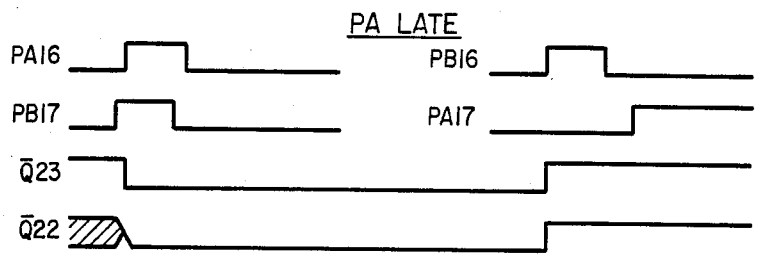

The time occurrence of the lead pulse PB at output 17, as represented by the pulse PB 17 of FIG. 1B, conditions the logic of the system of FIG. 1 such that upon the occurrence of the pulse PA at output 16, represented by the pulse PA 16 (FIG. 1B), causes the $\overline{Q}$ output at 22 of the phase comparator 21 to fall to a 0 logic level. Pulse PA 16 will also cause the $\overline{Q}$ output at 23 of the control 20 to fall to a 0 logic level. Accordingly, the pulse PA, upon its appearance at the summing junction 24, is unaffected. In other words, there is no delay introduced to pulse PA. However, when the pulse PB arrives at the output 16 of the one-shot multivibrator 15, it causes the logic level at the $\overline{Q}$ output 23 of the control 20 to rise to the 1 level and also clocks the phase comparator 21 to cause the logic level at the $\overline{Q}$ output 22 to rise to the 1 level, thereby introducing a delay to the pulse PB. The operation continues with the system hunting about the in phase relationship as between the pulses PA and PB.

Figure 3:
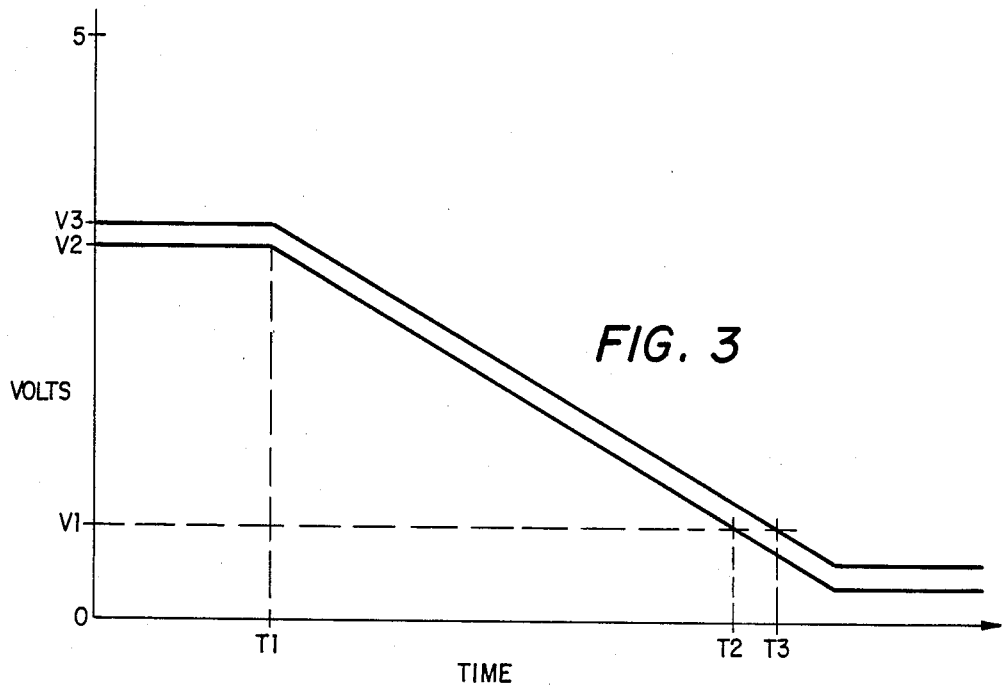
FIG. 3 is a significantly enlarged representation of the trailing edge of a pulse representing the logic levels thereof utilized in effecting discrete phase shifts in the practice of the present invention.

The discrete delays are effected by causing the voltage at summing junction 24 to rise and fall as between the two logic levels of 0 and 1. The affect of the change in voltage levels is illustrated in FIG. 3 which represents an enlarged representation of the trailing edge of a pulse occuring at the juncture 24. The pulse may be either the pulse PA or the pulse PB.

The one-shot multivibrator 13 is conditioned to trigger when the trailing edge of a pulse appearing at its inverted A input drops to a voltage level of $V_1$. Since the slope of the trailing edge of the pulse is a constant, the time it will take for the trailing edge to drop to the value of $V_1$ is a function of the voltage value of the pulse at time $T_1$. Under a condition of no delay, the voltage level of the trailing edge of the pulse at $T_1$ is $V_2$ and will fall to a trigger value of $V_1$ at time $T_2$. However, when the logic at the $\overline{Q}$ output 22 of the phase comparator raises to a 1 level the voltage of the pulse at the summing junction 24 rises to a value $V_3$, begins falling at time $T_1$ and reaches the triggering value $V_1$ for the one-shot multivibrator 13 at time $T_3$. Accordingly, each time the logic level at the summing junction 24 reaches a 1 level, a delay of approximately $T_3$ minus $T_2$ will be introduced to the affected pulse. The time difference of $T_3$ minus $T_2$ represents the discrete phase shifts introduced each time the pulses make one trip around the loop.

There will now be described a detailed description of the embodiment of FIG. 1. In the following description, reference will be made to the waveform timing diagrams of FIGS. 2A and 2B. The system is initialized by a CLEAR pulse from a source not shown. Because the total delay in loop 11 is 12.5 microseconds, the CLEAR pulse is held low for at least 12.5 microseconds and is applied to the CLR input 40 of the one-shot multivibrator 15 to prevent all existing pulses in the loop from being regenerated. The CLEAR pulse also is applied to the CLR input of the control flipflop 20 and the counter 30. The application of CLEAR to the CLR input 41 of the control flipflop 20 sets the flipflop to have a 0 logic level at its $\overline{Q}$ output 42 and a 1 logic level at its $\overline{Q}$ output 23. The application of CLEAR to the CLR input 43 of the counter 30 resets the counter. The two events, pulses PA and PB, whose time separation is to be measured are produced by circuitry not shown. Pulse PA is the first to occur. As previously described, the pulses PA and PB propagate around the loop 11 and represent two oscillators.

The control flipflop 20 has its $\overline{Q}$ output 23 coupled or fed back to its D input while the phase comparator flipflop 21 has its $\overline{Q}$ output at 22 fed back to its D input by way of logic network comprised of three NAND gates 50, 51, and 52. Thus, whatever state the control flipflop 20 is in, it will be reversed whenever a pulse is applied to its clock input CLK. However, because the coupling of the $\overline{Q}$ output at 22 of the phase comparator flipflop 21 to the D input is by way of the logic network, the state of the phase comparator 21 will be determined by whether pulse PA is leading and continues to lead pulse PB.

Figure 2A:
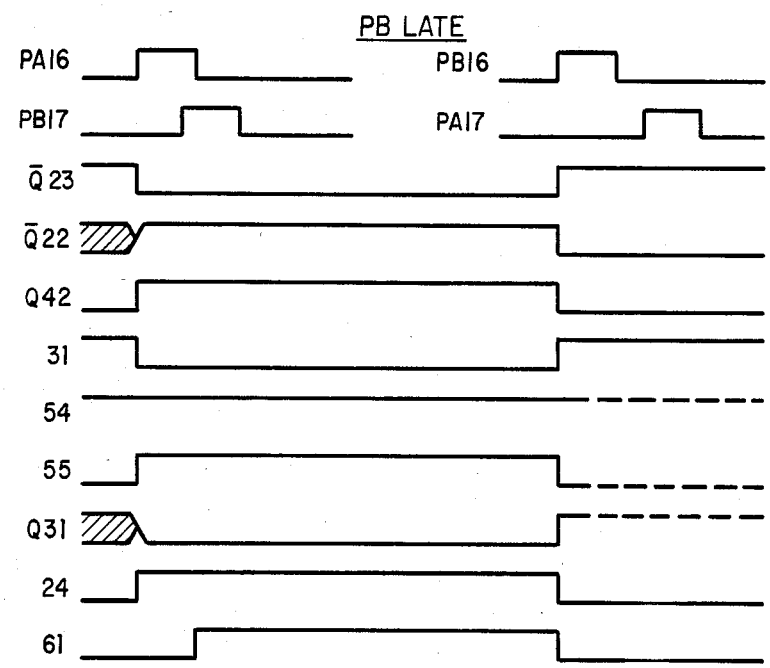
FIGS. 2A and 2B are more detailed waveform timing diagrams helpful in gaining an understanding of the detailed operation of the embodiment of FIG. 1.

Regardless of the initial state of the phase comparator flipflop 21, a 0 logic is applied to its D input immediately upon the application of the CLEAR pulse and for the following reasons. Prior to the application of the pulses PA and PB, a 0 logic level appears at and is applied from the output 17 of the multivibrator 13 to one input of the NAND gate 51 and a 1 logic level is applied to the other input of the NAND gate 51 from the $\overline{Q}$ output 23 of the control flipflop 20. Accordingly, the output of the NAND gate 51 at 54 is a logic 1. 0 logic is applied to one input of the NAND gate 50 from the $\overline{Q}$ output 42 of the control flipflop 20. That being the case, no matter what the logic level is at the $\overline{Q}$ output 22 of the phase comparator flipflop 21, the output of the NAND gate 50 will be a logic 1. Accordingly, with logic 1 levels applied to both inputs of the NAND gate 52, the output at 55 will be a logic 0. Now upon the application of the pulse PA to the one-shot multivibrator 15, there will appear at its output 16 a pulse PA 16 as shown in FIG. 1, which will clock the control flipflop 20 and the phase comparator flipflop 21. As shown in FIG. 2A, the logic level at the $\overline{Q}$ output 23 will drop to a logic 0 while the $\overline{Q}$ output of the phase comparator at 22 will be established at a 1 level. Similarly, the logic level at the Q output at 42 of the control flipflop 20 will rise to a 1 level and the logic level at the Q output 31 of the phase comparator flipflop 21 will drop to a 0 level. The logic level at the $\overline{Q}$ output 22 of the phase comparator 21 is fed back to one input of the NAND gate 50 and that 1 logic level appears at the output 55 of the NAND gate 52 and is applied to the D input of the phase comparator 21.

With a 1 logic level established at the $\overline{Q}$ output 22 of the phase comparator 21, the voltage level at summing junction 24 is raised to introduce a discrete phase or time delay to the pulse PA. Further, with the logic level at Q output 31 of the phase comparator dropped to 0 and applied to the inverted input up/down of the counter 30, the counter is instructed to count up upon receipt of the next clock pulse.

The clock pulse is applied by way of NOR gate 60, which has applied to one input the $\overline{Q}$ output 23 of the control flipflop 20 and to another input, the output of the one-shot multivibrator 15. Thus, with 0 logic level applied from the $\overline{Q}$ output of the control flipflop 20 to one input of the NOR gate 16, then upon the occurrence of the trailing edge of the pulse PA at output 16 of the one-shot multivibrator 15, the NOR gate has at its output 61 a level of logic 1 as shown in FIG. 2A, and this logic level is applied to the clock input of the counter 30. The counter then counts up 1, indicating one discrete time delay being introduced to the pulse PA.

When the pulse PB appears at the output 16 of the multivibrator 15, it triggers or toggles the phase comparator flipflop 21 and the control flipflop 20. The triggering of the phase comparator 21 causes its $\overline{Q}$ output at 22 to drop to a 0 logic level, which is then applied by way of impedence 25 to the summing junction 24, and as a result, the pulse PB passes the summing junction 24 and into the delay network 12 without any change or modification to its trailing edge. It then triggers the one-shot multivibrator 13 at time $T_2$ as shown in FIG. 3.

The operation continues with the logic levels at the D inputs of the phase comparator 21 and the control flipflop 20 toggling from one value to the other, and the $\overline{Q}$ output 22 of the phase comparator flipflop being raised to a 1 logic level each time the pulse PA appears at output 16 of the one-shot multivibrator 15. When the pulse PA arrives at its reference point 16 at the same time or within one discrete phase delay of the arrival of the pulse PB at its reference point 17, the pulses will be in phase.

When the pulses are substantially or effectively in phase, the system will overcompensate and hunt about the 0 phase relationship, as seen by the logic network 19, established between the pulse PA and the pulse PB.

Figure 2B:
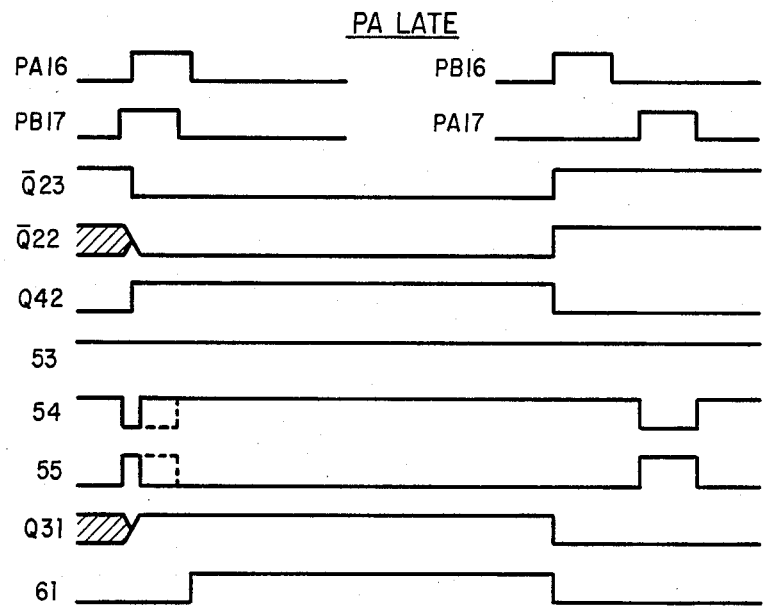

The situation that exists in the hunting process when the pulse PB now arrives at it reference point 17 before the pulse PA arrives at its reference point 16 is illustrated in FIG. 2B. The appearance of the pulse PB at reference point 17 establishes a 1 logic level at an input of the NAND gate 51 at a time when the logic level at the other input of that NAND gate is a logic 1. Accordingly, the logic level at the output 54 of the NAND gate 51 becomes a logic 0 and with a logic 1 appearing at the output 53 of the NAND gate 50, the logic level at the output 55 of the NAND gate 52 becomes a logic 1. Upon occurrence of the leading edge of the pulse PA at reference point 16, the control flipflop 20 and the phase comparator flipflop 21 are clocked or triggered and the logic level at the $\overline{Q}$ output 22 of the phase comparator drops to a logic 0. Accordingly, upon the appearance of the pulse PA at the summing junction 24, the pulse trailing edge is unaffected and hence a delay is not introduced to the pulse PA. At the same time, the logic level at the Q output 31 of the phase comparator goes to 1 instructing the counter to count down on the occurrence of the trailing pulse PA at reference point 16. The NOR gate 60 has a logic 1 at its output 61 to clock the counter and causes the counter to count down one delay increment.

Now upon the appearance of pulse PB at reference point 16, the control flipflop 20 and the phase comparator flipflop are clocked or triggered, and the output of the $\overline{Q}$ output at 22 of the phase comparator rises to the logic 1 level which will introduce a delay to the pulse PB upon its appearance at the summing junction 24. The delay will be sufficient enough so that pulse PA will arrive at its reference point 16 before the pulse PB arrives at its reference point 17 causing the $\overline{Q}$ output 22 at the phase comparator control flipflop 21 to rise to a logic 1 which, as shown in FIG. 2A, will cause the system to introduce a delay now to the pulse PA and condition the counter 30 to count up one. The delay is sufficient again to cause the pulse PA to arrive at its reference point 16 after the pulse PB arrives at its reference point 17 and the system continues as above described to hunt within one discrete phase delay and effectively cause the counter 30, for all practical purposes, to stop counting.

The total count measured at the output of the counter 30 after the counting has stopped is equivalent to the number of discrete phase shifts or delays necessary to delay PA until the two pulses came within one discrete phase shift of each other, as seen at their respective loop reference points, 17 for PB and 16 for PA. Thus the total count multiplied by the time value of the discrete phase delay, $T_3$ minus $T_2$, equals the initial time difference between the PA and PB and the external events that they represent.

Velocity Digitizer - MOD 1

Figure 4:
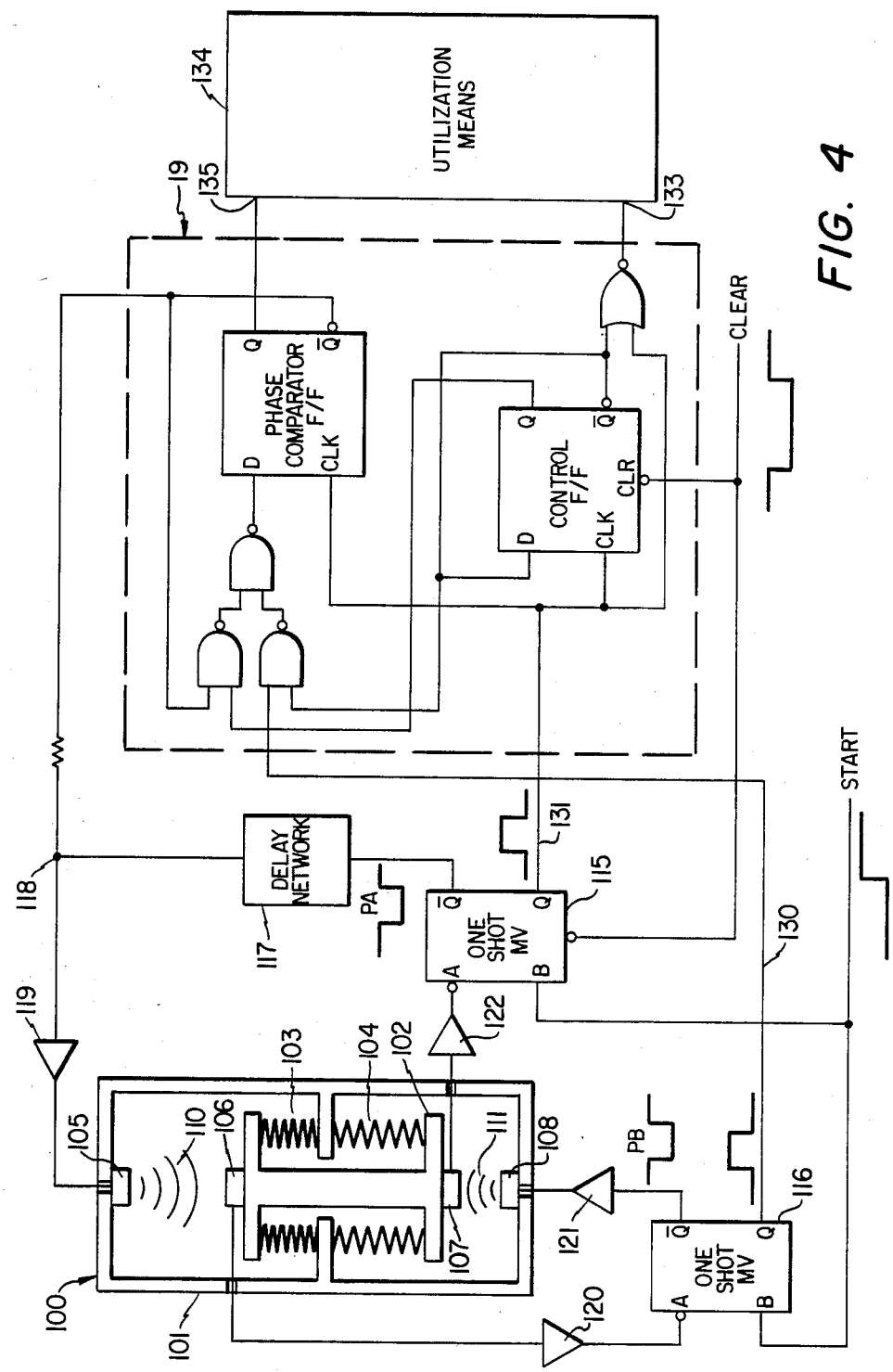
FIG. 4 is a schematic diagram of a direct digital geophone shown connected in the circuits which convert the velocity variations of the phone components to a direct digital signal.

Having described in detail the principles of the invention wherein two oscillators are employed together with logic circuitry to produce a direct digital representation of the phase or time displacement between two pulses, there will now be undertaken the description of an application of these principles to a velocity digitizer. The invention is generally applicable for use in digitizing the velocity or phase of any time varying function. The function may be the relative movement between any two objects. More specifically, embodying relative moving objects or mechanical parts would include such apparatus as ribbon microphones, geophones and similar instruments. In FIG. 4, there is illustrated the application of the present invention with a new and improved geophone 100.

Prior art geophones typically utilize or are comprised of a case or casing, a spring supported mass within the casing, and a coil. The geophone, when coupled to the earth, is responsive to earth movements which cause a relative displacement between the mass and the casing to generate with the coil an electrical analog signal which, in accordance with today's procedures, is digitized and recorded for data processing purposes. The prior art geophone has two severe drawbacks. One of these is the susceptibility to noise such as stray 60-cycle fields which are picked up by the coil. This noise is removed by the utilization of notch filters which tend to distort the signal or frequency content of the signal, in that notch filters will not only attenuate the unwanted 60-cycle signal, but also frequency components lying on either side of the 60-cycle component. In addition, the prior art geophones have limited dynamic range.

The new and improved geophone in accordance with the present invention avoids the undesirable characteristics of the prior art geophones in that it is non-responsive to stray electromagnetic fields, hence not requiring the use of notch filters, and furthermore provides a direct digital output of significantly increased dynamic range. More specifically, the geophone 100 is comprised of a case or casing 101 having mounted therein a mass 102, supported by resilient means such as springs 103 and 104. Within the casing 101 are means responsive to the appearance of pulses to introduce phase shifts to the pulses proportional to the instantaneous relative positions between the casing and the mass, and therefore representative of the relative velocity between the casing and the mass. The means are circuit elements with one of the elements being mounted on an inner surface of the casing and the other of the elements being mounted on the mass so that the phase shift is introduced by relative movement between the elements. As shown in the specific embodiment of FIG. 4, the elements include transmitter 105 mounted to the inner surface of the casing 101 and a receiver 106 mounted to an upper surface of the mass 102. In this embodiment, a second set of circuit elements is employed including the transmitter 108 mounted to an inner surface of the casing 101 and a receiver 107 mounted to a lower surface of the mass 102.

The geophone 100 is in a loop through which pulses PA and PB circulate. The circulation of the pulses around the loop effectively provides two oscillators.

The pulses PA and PB are respectively and simultaneously generated by one-shot multivibrators 115 and 116. Pulse PA, appearing initially at the $\overline{Q}$ output of the multivibrator 115, propagates by way of delay network 117 and summing junction 118 to the input of digital amplifier 119. There the pulse PA is amplified and applied to excite the piezoelectric transducer or transmitter 105 which now generates an acoustic pulse. The acoustic pulse travels, as shown at 110, by way of the air space within the casing 101 to the piezoelectric transducer or receiver 106. The resulting pulse at the output of the piezoelectric transducer 106 is applied to amplifier 120, and the amplified output propagates to the inverted input A of the one-shot multivibrator 116. The multivibrator 116 is triggered to produce the negative pulse PA at its $\overline{Q}$ output. This pulse is amplified by the amplifier 121 and applied to excite the piezoelectric transducer or transmitter 108. The resulting acoustic pulse travels, as shown at 111, by way of the air space within the casing 101 to the piezoelectric transducer or receiver 107. The electrical pulse output of the receiver 107 is amplified by the amplifer 122 and appears at the inverted input A of the one-shot multivibrator 115. The appearance of the pulse at the inverted input A of the multivibrator 115 causes the multivibrator to produce at its $\overline{Q}$ output the negative pulse PA and the process continues until interrupted. The circulation of the pulse PA or its equivalent around the loop in the manner described constitutes a first oscillator.

Pulse PB initially appears at the $\overline{Q}$ output of the one-shot multivibrator 116 and thereafter follows a path around the loop as previously described in conjunction with the propagation of the pulse PA. The circulation or propagation of the pulse PB or its equivalent constitutes a second oscillator.

During each loop cycle, both pulses PA and PB travel through the same path. Since the instantaneous path does not vary, the loop frequency of the pulses PA and PB does not vary except due to phase modulation caused by the casing-to-mass relative velocity. Inasmuch as pulses PA and PB are initially separated in phase in the loop, the phase modulation caused to the pulse PB by the motion of the mass 102 will be different from the phase modulation applied to PA. For example, when the mass 102 is moving in a downward direction, the time for pulse PB to circulate around the loop is increased while the time for the pulse PA to circulate around the loop is decreased. The difference in the loop times between the pulses PA and PB results in a relative phase shift between the pulses and the magnitude of this phase shift is proportional to the relative casing-to-mass velocity.

The system of FIG. 4 further includes the logic arrangement shown enclosed within block 19. This logic arrangement or network 19 is the same as that described above in conjunction with FIG. 1.

The operation of the system of FIG. 4 is begun by initially clearing the loop with a low CLEAR signal applied to the CLR input of multivibrator 115. The time duration of the CLEAR pulse is at least as long as one loop cycle to assure the termination of any pulses then circulating within the loop. The CLEAR signal also sets the control flipflop in the logic network 19. A START pulse is now generated by a source not shown and is applied simultaneously to the B inputs of the multivibrators 115 and 116, thereby simultaneously generating the pulses PA and PB. The Q output, a positive pulse, of the one-shot multivibrator 116 is applied by way of conductor 130 to the NAND network within the logic system 19 and the Q output, a positive pulse, of the one-shot multivibrator 115 is applied by way of conductor 131 to clock the phase comparator flipflop and the control flipflop in the logic network 19.

The pulse PA appearing at the $\overline{Q}$ output of the multivibrator 115 is negative going, and applied initially to the delay network 117. The delay introduced by the network 117 is provided in order to permit time for the phase comparator flipflop output at $\overline{Q}$ to be applied to the summing junction 118 before the leading edge of the pulse PA arrives at the summing junction. The delay is of a small order, for example 50 nanoseconds. The delay network may be provided by transistor-transistor logic.

Since the pulses PA and PB are started in the loop in phase as seen by the logic network 19, the leading edge of the pulse PB at the D input to the phase comparator flipflop will generally not be more than one discrete phase shift from the pulse PA at the flipflop clock inputs CLK.

The relationship between the pulses PA and PB at the logic network 19 and the various logic states within the network will be similar to those illustrated in FIGS. 2A and 2B. If the leading edge of the pulse PB occurs at its reference point, the Q output of the multivibrator 116 before the pulse PA appears at its reference point, the Q output of the multivibrator 115, a delay will be applied to the leading edge of the pulse PB at the summing point 118. The delay is caused by the phase comparator flipflop changing state and applying a logic 1 level from its $\overline{Q}$ output to the summing junction 118 to cause a discrete phase shift to the leading edge of the pulse PB. On the other hand, when the pulse PB occurs after the pulse PA, as shown in FIG. 2A, then the circuitry will cause a discrete phase shift or delay to the pulse PA.

The delay provided at the summing point 118 is small compared to the total loop time. For example, the magnitude of this delay might be about 1 nanosecond when the loop time is about 10 microseconds. The loop frequency is usually chosen to be at least twice the highest frequency of the velocity to be digitized.

Each time the pulse PA appears at its reference point Q of the multivibrator 115, it is clocked through the logical NOR gate in the logic network 19. The trailing edge of the pulse PA will appear as a positive going edge at the input 133 of the utilization means 134 and is used as a strobe to indicate that the output from the phase comparator flipflop applied to the second input 135 of the utilization means 134 is valid. The input signal to the utilization means at 135 will be a series of 1's and 0's based upon decisions made by the logic network 19. If the mass 101 is moving very quickly in one direction, there will be a series of logic 1's. If the mass is moving quickly in another direction, there will be a series of logic 0's. If the mass 102 is stationary, the output of the logic network 19 will be a series of alternating 1's and 0's. Between the two limits of movement, the signal from the logic network 19 will be comprised of varying sequences of logic 1's and logic 0's.

The utilization means 134 may take any desired form. It can comprise a recorder to which the output from the logic network 19 is applied directly for processing at another site. On the other hand, the utilization means may comprise a low-pass filter, the output of which will be a multi-bit binary code representing the velocities of the mass 102 relative to the casing 101. The utilization means may also take the form of a D-A convertor in which the output of the logic network 19 is converted to an analog signal and displayed for analysis at the site or recorded for analysis at a remote location.

Velocity Digitizer - Mod II

It will be recalled that in the embodiment of a velocity digitizer illustrated in FIG. 4, the device whose velocity was to be digitized, in this case a geophone 100, was located directly in the loop through which the pulses PA and PB were circulating. In the embodiment illustrated in FIG. 5, the device whose velocity is to be measured is located outside the circulating loop and the operation is such that delays are introduced by the device effectively only to one of the pulses.

Figure 5:
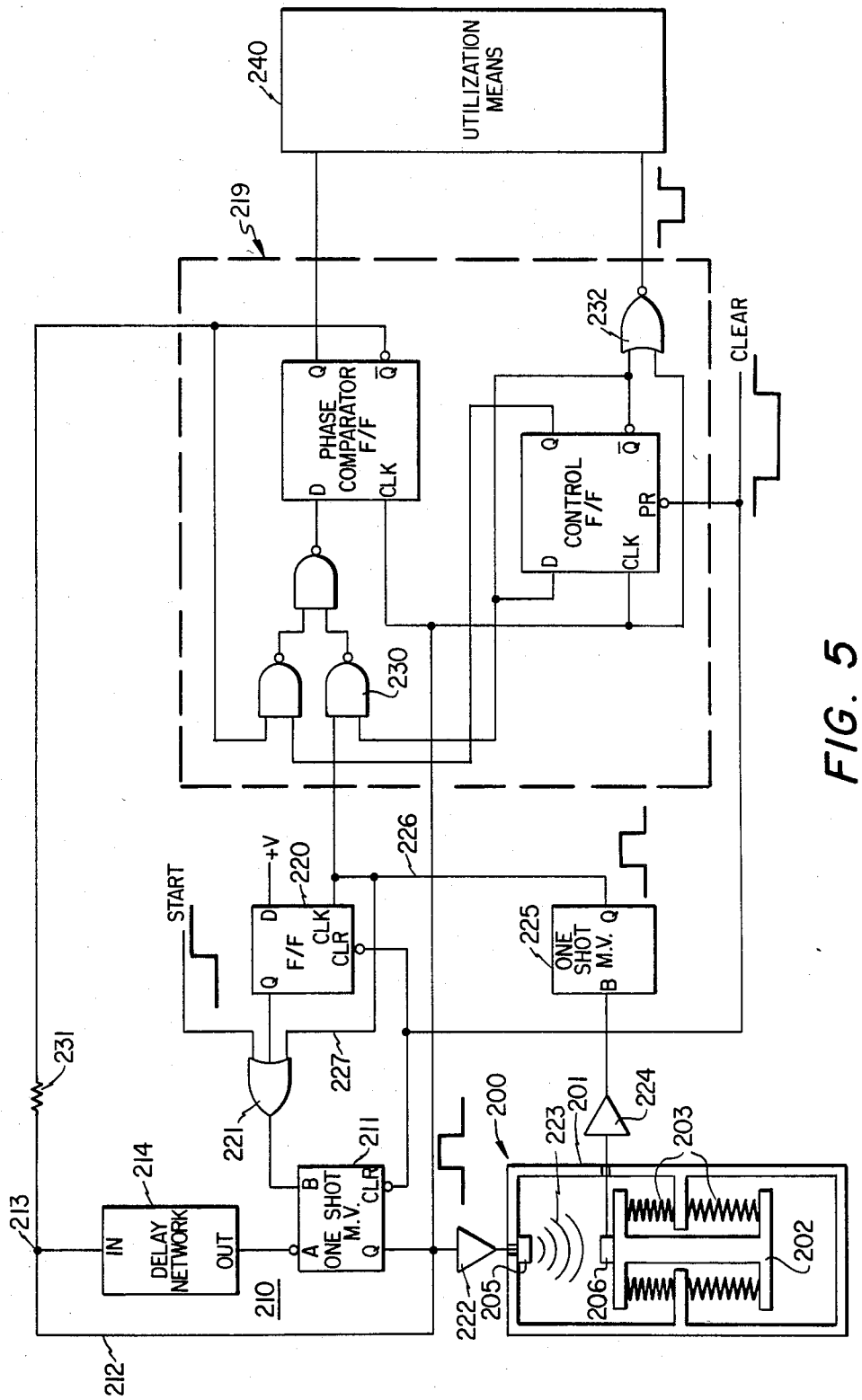
FIG. 5 is another species of the invention incorporating a modified direct digital geophone together with the logic elements for converting variations in velocity of the geophone to digital representations.

The device in FIG. 5 is a novel geophone 200 comprised of a case or casing 201 having mounted therein a movable mass 202. The mass 202 is supported for relative movement within the case or casing 201 by a pair of springs 203.

The geophone 200 is different from any geophones of the prior art in that in lieu of a coil used in prior art geophones for generation of an electrical analog signal representative of movement of the mass 202 relative to the case or casing 201, the geophone 200 includes non-inductive circuit elements mounted respectively to the inside surface of the case 201 and to a surface of the mass 202. More specifically, the circuit elements are shown as transducers including a transmitting transducer 205 mounted to the inside surface of the case 201 and a receiving transducer 206 mounted to the upper surface of the mass 202. Whereas the geophone 100 of FIG. 4 includes two pairs of circuit elements or transducers, the geophone 200 of FIG. 5 includes but one pair.

The embodiment of FIG. 5 includes a loop 210 through which pulses PA and PB will circulate. The pulses will propagate from the Q output of the one-shot multivibrator 211, thence by way of conductor 212, summing junction 213, delay network 214, and back to the inverted input A of the one-shot multivibrator 211.

The circulation of the pulses PA and PB will provide the two oscillators which are the principal elements of the present invention.

In this embodiment, pulse PA will serve as a reference, and only the phase change applied to the pulse PB by the geophone 200 will be utilized in the digitizing operation. More particularly, the pulse PB propagates through a circuit including the geophone 200 which introduces a delay proportional to the displacement or velocity to be measured. The pulse PB is then compared to pulse PA circulating in the loop 210 by the phase comparator in the logic network 219. Through the use of the phase comparator, a discrete phase shifter and the control flipflop, there is encoded the rate of change of displacement, and therefore velocity, of the relative velocity of the elements comprising the geophone 200.

As a first step in the operation of the system shown in FIG. 5, a CLEAR signal having a 0 logic level and a time duration at least as long as one loop cycle is utilized to clear the loop by removing any pre-existing pulses circulating within the loop. The CLEAR signal is applied to the CLR input of the one-shot multivibrator 211 and the flipflop 220 and to the PR input of the control flipflop included within the logic network 219. The Q output of the control flipflop is set to a 1 logic level and the Q output of the flipflop 220 is set to a 0 logic level. The PR or preset input of the control flipflop is similar to the CLR or clear input except that the application of a 0 signal to that input forces the Q output to a 1 and the $\overline{Q}$ output to a 0. The use of the PR input to the control flipflop is the only variation between logic networks 19 and 219.

A START pulse generated from a source, not shown, is applied to one input of the OR logic gate 221 and its leading edge propagates to the B input of the one-shot multivibrator 211 to excite the multivibrator and generate at its Q output the pulse PB. The pulse PB now circulates around the loop 210 by way of conductor 212, summing junction 213, and delay network 214 to the inverted input A of the multivibrator 211. The negative going or trailing edge of the pulse PB triggers the one-shot multivibrator 211 and the process continues with pulse PB circulating about the loop, thereby providing one of the two oscillators.

When pulse PB first appears at the Q output of the one-shot multivibrator 211, its leading edge clocks both the phase comparator and control flipflops. The effect of this is to initialize the control flipflop such that its Q output is a logic 0 and its $\overline{Q}$ output is a logic 1. In FIGS. 1 and 4 the pulse PA is started first. In FIG. 5 the pulse PB is started first and the logic network 219 is preset by the CLEAR signal. Thus, when PB first appears, the control flipflop changes states and places the logic network 219 in the same starting condition provided for logic network 19. Now, when pulses PA and PB circulate in the loop and are applied to the logic network 219, they will serve the same functions as the previously described pulses PA and PB when applied to logic network 19.

The pulse PA is generated for circulation in the loop 210 in response to the first appearance of the pulse PB at the Q output of the multivibrator 211. The pulse PB is applied to amplifier 222 and the amplified output excites the piezoelectric transmitter 205 to generate an acoustic wave or pulse 223. Upon arrival of the acoustic pulse, traveling by way of the air space within the case or casing 201, at the piezoelectric receiver 206, an electric signal or pulse is generated, amplified by the amplifer 224 and applied to the B input of a one-shot multivibrator 225. The multivibrator 225 is excited to regenerate pulse PB as a positive going pulse which propagates along conductors 226 and 227 to an input of the NOR logic gate 221 and appears at the B input of the one-shot multivibrator 211. The multivibrator 211 is excited now to generate at its Q output the pulse PA. The pulse PA now begins circulating in the loop 210 in a manner described in conjunction with the circulation of the pulse PB.

The pulse PB is also applied by way of conductor 226 to the CLK input of the flipflop 220. The flipflop will now change state to produce at its Q output a 1 logic level. With a 1 logic level applied to the D input of the flipflop 220, the flipflop 220 will be non-responsive to any further positive pulses applied to its clock input and will maintain at its Q output a logic 1 and thereby effectively and for all practical purposes gating shut the B input of the one-shot multivibrator 211. This arrangement prevents the one-shot multivibrator 211 from producing any pulses other than as a result of pulses being applied to its inverted input A.

The appearance of pulse PA at the Q output of the one-shot multivibrator 211 is effective to clock the phase comparator flipflop and the control flipflop within the logic network 219, and this will be the sole function of pulse PA, that is, to clock the phase comparator flipflop and the control flipflop each time the pulse appears at the Q output of the multivibrator 211. While the pulse PA propagates along a path that includes the amplifier 222, the transducers 205, 206, the amplifier 224 and appears again at the output of the one-shot multivibrator 225, its appearance at the Q output of the multivibrator 225 does not affect the D input of the phase comparator flipflop within the logic network 219. This is by reason of the fact that the NAND gate 230 within the logic network 219 is conditioned by the control flipflop $\overline{Q}$ output such that positive going pulse PA appearing on the conductor 226 is ineffective to change the output of the NAND gate 230. It will be recalled that the flipflop 220 has been conditioned such that further positive pulses applied to its CLK input will be ineffective to change the state of the flipflop, and therefore the pulse PA, and indeed future occurrences of the pulse PA at the CLK input of the flipflop 220, will be ineffective to change its state.

In the embodiment illustrated in FIG. 5, the reference point in the system for the pulse PA is the Q output of the one-shot multivibrator 211 and the reference point for the pulse PB is the Q output of the one-shot multivibrator 225. Under start conditions above-described, the pulses PA and PB appear at their respective reference points at approximately the same time, and therefore are viewed by the logic network 219 as being in phase while they propagate around the loop 210 in an out-of-phase relationship.

When the pulse PB is early with respect to pulse PA, that is, the pulse PB arrives at its reference point, the Q output of the multivibrator 225, before the pulse PA arrives at its reference point, the Q output of the multivibrator 211, a logic 1 will appear at the Q output of the phase comparator flipflop and a 0 logic level will appear at the $\overline{Q}$ output of the same flipflop. The 0 logic level will be applied by way of impedence or resistor 231 to the summing junction 213, and the pulse PA will pass through the junction 213 without delay being applied to its trailing edge. Now when the pulse PB next appears at the Q output of the one-shot multivibrator 211, its leading and positive going edge will clock the phase comparator flipflop and cause it to change state. Thus, a logic 1 will now appear at the $\overline{Q}$ output of the phase comparator flipflop and will propagate through the resistor 231 to the summing junction 213 where it will cause the trailing edge of the pulse PB to be delayed. When the pulse PB is late with respect to the pulse PA, that is, the pulse PA arrives at its reference point before the pulse PB arrives at its reference point, the reverse will hold true. PA will be delayed and pulse PB will not.

The delay introduced at the summing junction 213 is very small compared to the total loop time. For example, the delay may be of the order of 1 nanosecond while the loop time may be as high as 10 microseconds. The loop time or frequency is preferably chosen to be at least twice the highest frequency of the relative velocity between the mass 202 and the case 201 of the geophone 200.

The detail operation of the logic network 219 has not been described in order to reduce the length of the specification and avoid redundancy. The operation of the logic network 219 has already been described in the operation of the logic network 19 in conjunction with the embodiment of FIG. 1.

Each time the pulse PA appears at its reference point, a positive pulse is applied to an input of the logic NOR gate 232. The trailing edge of the pulse PA appears as a positive going edge at the output of the NOR gate 232 and is applied to the utilization means 240 as a strobe to indicate that the logic level appearing at the Q output of the phase comparator flipflop is valid and is to be utilized. The signal at the Q output of the phase comparator flipflop will have logic 1's proportional to the velocity of the mass 202 moving in an upward direction and logic 0's proportional to the velocity of the mass 202 moving in a downward direction. This digital pulse train is applied from the Q output of the phase comparator to an input of the utilization means and is indicative of the variations in velocity of the mass 202 relative to the casing or case 201. The utilization means may be a digital low-pass filter to generate a multiple bit binary word at a lower data rate. On the other hand, the pulse stream from the phase comparator flipflop Q output may be processed by an analog low-pass filter to construct an analog representation of the original variable.

The identical logic network 19 has been utilized in each of the embodiments of FIGS. 1 and 4 and, with the exception noted above, has been repeated as logic network 219 in the embodiment of FIG. 5. The function of the logic network is to identify which of the pulses PA or PB is leading and upon such determination, to generate a logic 1 level or a logic 0 level selectively to apply a discrete phase or time delay to the leading pulse in order to bring the pulses to an in-phase relationship as seen by the logic network. With the function of the logic network 19 clearly in mind, it will be obvious to those skilled in the art that other logic networks may be utilized to effect the same function and accordingly, the invention may be carried out with logic networks of design and components other than that illustrated by the logic network 19.

ANALOG-TO-DIGITAL CONVERTOR

Figure 6:
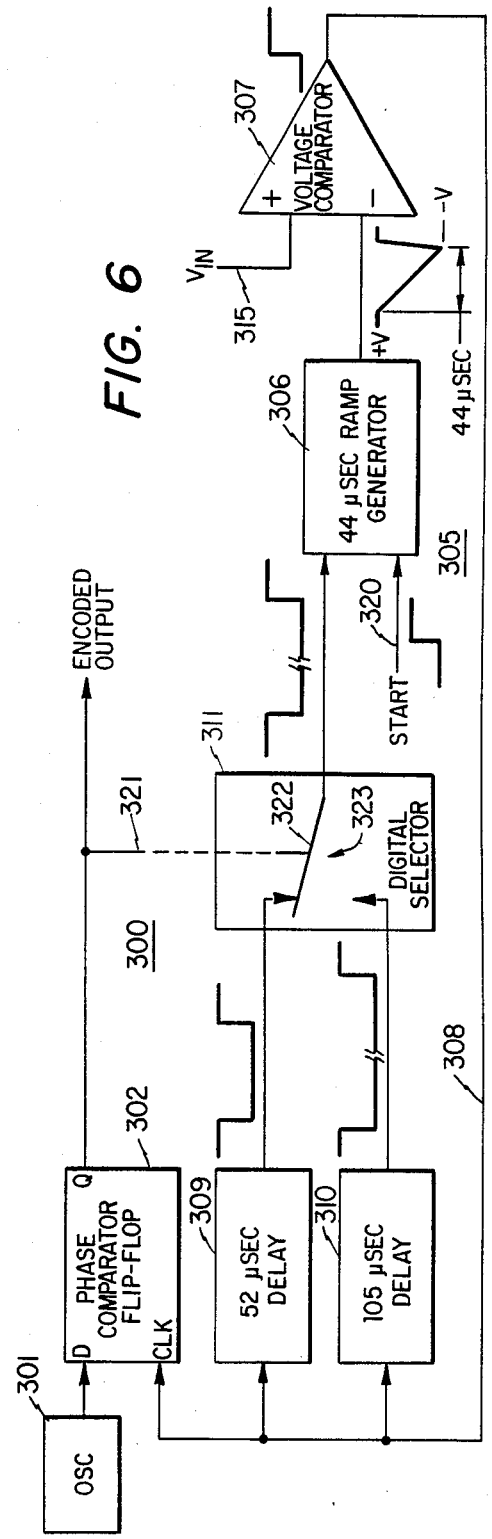
FIG. 6 is a schematic diagram of an analog-to-digital converter embodying features of the present invention.

FIG. 6 illustrates an analog-to-digital convertor 300 which utilizes the basic principles of the present invention in that two oscillators are present. It differs from the earlier described embodiments in that the two oscillators or two circulating pulses do not share the same electrical loop. The first oscillator 301 may be any one of a variety of oscillators which operate at a selected suitable frequency. A suitable frequency in the practice of the present invention, for example, might be chosen to be at least twice the frequency of the analog input voltage to be digitized in order to satisfy Nyquist's sampling theorem. For the purpose of the present description, the oscillator 301 produces a square wave output at a frequency of 10,000 Hertz. The output of the oscillator 301 is applied to the D input of a phase comparator flipflop 302.

A second oscillator 305 is comprised of a loop including ramp generator 306, voltage comparator 307, conductor 308, delay means 309 and 310, and digital selector 311. The second oscillator 305 operates as follows. A START pulse from a source not shown is applied by way of conductor 320 to an input of the ramp generator 306. When triggered by the START pulse, the ramp generator 306 produces a negative going ramp function 307 (FIG. 7) which is applied to the inverting input of voltage comparator 307. The ramp function decreases linearly from a voltage of $+V$ to $-V$ over a predesigned period, for example, 44 microseconds. The ramp generator may be constructed with transistors or integrated circuits with techniques well known in the art. Assuming that 0 voltage is applied to the non-inverting input of the voltage comparator 307, the voltage comparator will initially have a 0 logic output until the ramp voltage decreases to a value less than 0 whereupon the output of the comparator will go to a 1 logic level. The transition from the 0 logic to the 1 logic level is utilized to trigger the delay means 309 and 310, whose negative pulse outputs are applied to the digital selector 311. The selector 311 selectively gates one of the negative pulses to trigger the ramp generator 306. So long as 0 signal is applied to the voltage comparator 307, a pulse effectively will circulate about or propagate through the loop 305 at a fixed frequency, thereby providing the function of the second oscillator.

The voltage to be digitized is Vin applied by way of conductor 315 to the non-inverting input of the voltage comparator 307. Inasmuch as the ramp generator covers a range of $+V$ to $-V$, the system will be capable of digitizing any varying analog voltage whose amplitudes lie within that range. Before being triggered by the START signal, the ramp generator 306 output is at $+V$ which, being greater than Vin, causes the voltage comparator 307 to have a logical output at the 0 level. Upon being triggered by START, the ramp generator output voltage will begin to linearly decrease toward $-V$. When the ramp voltage becomes less than Vin, the output of the voltage comparator 307 will go to its logic 1 level, trigger the delay means 309 and 310, and also clock the phase comparator flipflop 302. The ramp output of the generator 306 will continue to the $-V$ level at which time the output will rapidly return to $+V$ and the output of the voltage comparator 307 will return to the 0 logic level. If the 10,000 Hertz square wave from the oscillator 301 is low at the time the phase comparator or encoder 302 is clocked, then a logical 0 will appear at the Q output of the phase comparator or encoder. On the other hand, if the clocking of the phase comparator or encoder 302 occurs when the square wave is at a high level, then a logic 1 will appear at the Q output of the comparator 302. The logic level at the Q output of the phase comparator 302 is utilized to control the operation of the digital selector 311. This operation is shown schematically by dashed line 321, figuratively connecting the logic levels from encoder 302 to the movable arm 322 of switch 323, signifying the switching operation of the digital selector. A logic level of 0 effectively moves the arm to connect with the output from one of the delay means, whereas a logic level of 1 causes the arm to move and connect with the output from the other delay means.

The delay means 309 generates a 52 microsecond negative pulse, and the delay means 310 generates a 105 microsecond negative pulse. These delays can be generated with one-shot multivibrators or with other techniques well known in the art. A 105 microsecond delay was chosen since it is slightly greater than the 100 microsecond period of the 10,000 Hertz oscillator while the 52 microsecond period was chosen since it is slightly greater than one-half of the 100 microsecond period. Similarly, the 44 microsecond ramp time for the generator 306 was selected because it is less than one-half of the 100 microsecond period. While the exact values of these times is not critical, the time relationships as between the various delays and the ramp function are related to the period of the signal generated by the oscillator 301.

The transition of the ramp voltage through the value of Vin and therefore the change in the voltage comparator output from the 0 logic level to the 1 logic level, is compared with the 10,000 Hertz square wave on each cycle. If the positive transition of the voltage comparator occurs before the positive transition of the square wave, then the phase comparator 302 will latch a 0 logic level at its Q output. This 0 logic level causes the digital selector 311 to gate the 105 microsecond pulse to the ramp generator 306 to cause a delay in the loop greater than the external oscillator period. If the positive transition of the voltage comparator occurs after the positive transition of the square wave, then the phase comparator 302 will latch a 1 logic level at its Q output. This 1 logic level causes the digital selector 311 to gate the 52 microsecond pulse to the ramp generator 306 to cause a delay in the loop less than the external oscillator period. The actual loop time on each cycle of the oscillator 305 will thus be either the time caused by the value of Vin + 52 microseconds or the time caused by the value of Vin + 105 microseconds with the addition of other minor circuit delays common to both cases. If the 52 microsecond delay is utilized, then the total delay will vary from 52 microseconds to 52+44 or 96 microseconds, depending upon the value of Vin. If the 105 microsecond delay is utilized, then the delay will vary from 105 microseconds to 105+44 or 149 microseconds, depending upon the value of Vin. The frequency of the oscillator 305 will remain at 10,000 Hertz, the same as the reference frequency from the oscillator 301, but its phase will vary by almost one-half cycle from the reference.

Each complete cycle or frame of the 10,000 Hertz square wave from oscillator 301 must be compared for valid results. The selection of the delays of the delay means 309 and 310 is such that the short delay of 52 microseconds will assure that the sampling will not skip the next occurring frame or cycle from the oscillator 301 while the longer delay of 105 microseconds will assure that the sampling will take place in the next succeeding frame.

Figure 7:
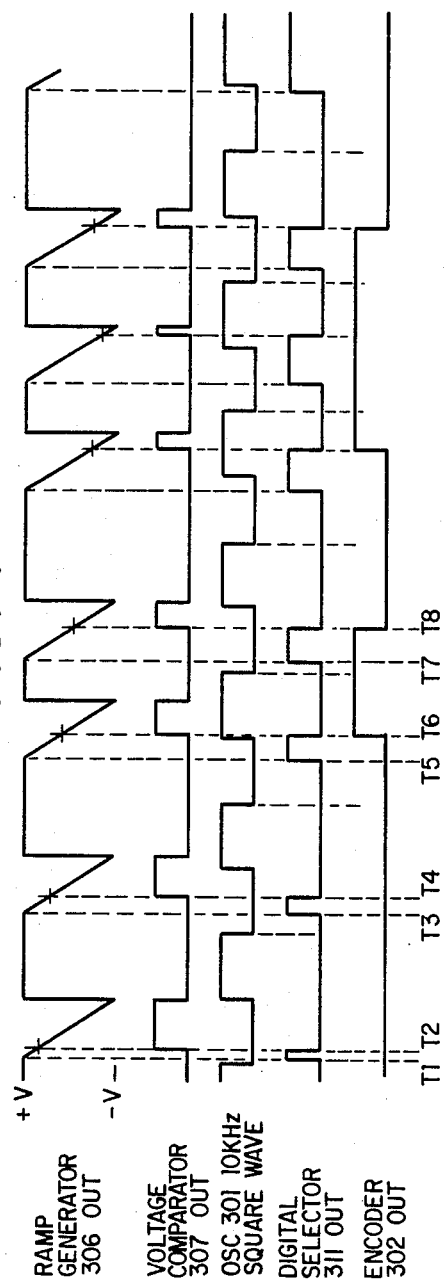
FIG. 7 is a pulse timing diagram helpful in the understanding of the operation of the embodiment of FIG. 6.

The operation of the system of FIG. 6 is illustrated by the wave form timing diagram of FIG. 7, wherein the points Vin on the ramp generator output 307 are a locus of points depicting the analog voltage Vin. The variation in Vin would seem to be very slow moving. That is because the analog voltage Vin is shown on a very much expanded time scale.

At time $T_1$, the digital selector 311 output becomes positive going, triggering the ramp generator 307. The value of the ramp function is compared with the value of Vin. At time $T_2$ the value of the ramp function has fallen just below the sample value of the voltage Vin and the output of the voltage comparator 307 goes positive to clock the phase comparator 302 (FIG. 6). At that moment, the output of the oscillator 301 is at a logic 0 and the output of the encoder or phase comparator 302 is a logic 0. The digital selector 311 responds to the 0 logic and applies the 105 microsecond delay to the input of the ramp generator. At time $T_3$ the output of the digital selector 311 goes positive and triggers the ramp generator 307 to produce another ramp function and to sample the value of the analog voltage Vin. The output of the voltage comparator 307 goes positive at time $T_4$ at which moment the value of the output of oscillator 301 is a logic 0. As a result, the digital selector applies another long delay in response to the 0 logic output of the encoder 302.

At time $T_5$ the output of the digital selector 311 again goes positive, triggering the ramp generator with the resultant sampling of the analog voltage Vin at time $T_6$. The output of the voltage comparator 307 again goes positive. At that moment, the output of the oscillator 301 is at a logic 1 and the encoded output of the phase comparator 302 becomes a logic 1 causing the digital selector 311 to select the shorter delay from the 52 microsecond delay means 309 (FIG. 6). Now at time $T_7$, the output of the digital selector 311 goes positive, triggering the ramp generator with the resultant sampling of the value of the analog voltage Vin occurring at time $T_8$. The output of the voltage comparator 307 goes positive, and the phase comparator has the logic 0 level applied to its D input from the oscillator 301 to produce a logic 0 at its output at time $T_8$.

The process continues with either a short delay or a long delay selected by the digital selector 311 in order that the logic level of the oscillator output be sampled at each and every frame of the oscillator output. The result is a single weighed digital function produced at the output of the encoder or phase comparator 302. Like the single weighed digital pulse output of the earlier described velocity digitizers, the output of the encoder or phase comparator 302 can be processed by a digital low-pass filter to generate a multi-bit binary word at a lower data rate or it can be processed by an analog low-pass filter to construct an analog representation of the original variable.

Now that the invention and a number of embodiments have been described, variations and modifications will become apparent to those skilled in the art. It is intended that such modifications and variations be encompassed within the scope of the appended claims.

What is claimed is:

1. The method of generating a digital representation of an analog condition comprising the steps of:
    (a) generating with two means, each independent of the other, two high-frequency digital pulse signals the frequencies of which are harmonically related one to the other;
    (b) applying a representation of the analog condition to at least one of said means to cause a shift in-phase in at least one of the digital signals;

(c) comparing the digital signals to obtain a measure of the phase shift, said signals being compared being of constant frequency;

(d) utilizing the measure of the phase shift to adjust the phase of the signals toward an in-phase condition; and (e) generating a digital function representative of the amplitude of the adjustment utilized to return said digital signals toward the in-phase condition.

2. The method of claim 1 in which said analog condition is applied to effect a shift in phase of both digital signals.

3. The method of claim 2 in which said measure of the phase shift is utilized to introduce a delay in the one of said phase shifted signals which is in advance of the other.

4. The method of claim 1 in which said measure of the phase shift is utilized to introduce a correction to in the phase shifted signal to return said phase shifted signal toward an in phase condition with the other signal.

5. The method of claim 1 in which said two high frequency digital signals are generated by introducing two pulses at spaced points in a loop and introducing in said loop a representation of said analog condition to effect a phase shift as between said digital signals.

6. The method of claim 1 in which said digital function is applied to a low-pass digital filter to produce a multi bit digital function.

7. The method of claim 1 in which said digital function is representative of the magnitude of said analog condition.

8. The method of claim 1 in which said digital function is representative of the rate of change of said analog condition.

9. The method of claim 1 in which said digital function is applied to a low-pass analog filter to produce an analog function representative of said analog condition.

10. A system for digitizing a representation of an analog condition comprising:

(a) two means for generating time spaced digital pulse signals and whose frequencies are harmonically related one to the other, each said means comprising an oscillator;

(b) means responsive to a representation of said analog condition to effect a relative phase shift between said digital pulse signals;

(c) means for measuring said relative phase shift; both said digital pulse signals appearing at said measuring means having a constant frequency;

(d) means responsive to the measure of said relative phase shift to return said signals toward an in-phase relationship;

(e) means for producing a digital function representation of said measure of relative phase shift; and (f) means for utilizing said digital function.

11. The system of claim 10 in which said measuring means is a logic network including a phase comparator.

12. The system of claim 10 in which said utilizing means is means for converting said digital function to multi-bit binary words.

13. The system of claim 12 in which said converting means is a low-pass digital filter.

14. The system of claim 10 in which said utilizing means includes a low-pass analog filter and means for recording the output of said filter.

15. The system of claim 10 in which said means responsive to said analog condition is a geophone.

16. The system of claim 10 in which said analog condition responsive means effect a shift in phase of one of said generating means.

17. The system of claim 10 which said analog condition responsive means effects a shift in phase of both said generating means.

18. The system of claim 17 in which said means responsive to the measure of said relative phase shift introduces a delay in the one of said phase shifted signals which is in advance of the other.

19. The system of claim 16 in which said means responsive to the measure of said relative phase shift introduces a correction to in the phase shifted signal to return said phase shifted signal toward an in-phase condition with the non-phase shifted signal.

20. The system of claim 10 in which said oscillators comprise a loop including two separated one shot multivibrators, means for applying a start pulse simultaneously to both multivibrators to generate two pulses which circulate in said loop, and in which said means responsive to said analog condition is connected in said loop between said multivibrators.

21. The system of claim 10 in which said oscillators comprise a loop and means for introducing two pulses at spaced points in said loop after a representation of said analog condition effects the phase relationship of said two pulses.

22. The system of claim 10 in which said oscillators comprise a loop, means for introducing two pulses at spaced points in said loop, and means for introducing between said loop and said means for measuring said relative phase shift a representation of said analog condition to effect a phase shift in at least one of said digital signals.

23. The system of claim 10 in which one of said oscillators produces a constant frequency, constant phase digital signal and the other of said oscillators comprises a loop generating a second digital signal, and means for introducing in said loop a representation of said analog condition to effect a phase shift in said second digital signal.

24. The system of claim 16 in which said means for introducing a phase shift to a digital pulse with the phase shift being proportional to a value of an external analog condition comprises a housing, a mass of fixed dimensions, said housing and said mass being movable relative to one another in response to said external condition, an input for receiving digital pulses, means within said housing responsive to the appearance of said digital pulses at said input for introducing a phase shift in said digital signals proportional to the relative positions between said housing and said mass.

25. The apparatus of claim 24 in which said means within said housing are circuit elements, one of said elements being mounted on an inner surface of said housing and another of said elements being mounted on said mass whereby the phase shift is introduced by relative movement between said elements.

26. The apparatus of claim 24 in which the external analog condition is acoustic energy.

27. The apparatus of claim 26 in which the acoustic energy is represented by movements of the earth.

28. Apparatus according to claim 25 wherein the apparatus is a geophone and said circuit elements are transducers, one said transducer being a transmitter and the other of said transducers being a receiver.

29. Apparatus according to claim 28 in which said transducers are acoustic transducers.

30. Apparatus according to claim 29 in which said acoustic transducers are piezoelectric devices.

31. Apparatus according to claim 24 in which said digital pulses have an occurrence rate in the order of 100 kilohertz.

32. The system of claim 15 in which said geophone comprises a casing, a spring mounted element within said casing responsive to earth movement to move with said casing in proportion to the earth movement, said elememt having opposite faces, a non-inductive transducer element mounted on one of said faces for movement with said spring mounted element, a mating non-inductive transducer element mounted on an opposed inside surface of said casing, said transducer element and said mating transducer element forming a transducer assembly which is responsive to movement of said spring mounted element to produce signals representative of the instantaneous position of said spring mounted element relative to said casing.

33. The system of claim 32 in which said transducer element is a high frequency acoustic transmitter and said mating transducer element is a high frequency acoustic receiver.

34. The system of claim 32 in which a second transducer element is mounted on an opposite face of said spring mounted element and a second mating transducer is mounted on an inside surface of said housing opposite said second transducer element to form a second transducer assembly.

35. The system of claim 34 in which said transducer elements and said mating transducer elements are piezoelectric devices.

36. The system of claim 32 including means for generating two time spaced constant frequency digital pulses and in which said relative positions of said transducer elements varies the phase relationship between said pulses to produce said signals.

37. The system of claim 36 including a logic network for determining the phase relationship of said signals for producing a single weighted digital function representative of said phase relationship.

38. The system of claim 37 in which said transducer elements are in a circuit comprising a loop and said logic circuit detects the time occurrence of said pulses at two spaced reference points in said loop.

39. The system of claim 38 in which said logic network includes a phase comparator, said logic network producing a signal for modifying the time occurrence of at least one of said pulses in said loop.

40. The system of claim 39 in which said logic network signal delays the pulse arriving first at its reference points by a discrete amount to bring both pulses toward an in-phase relationship as seen by said comparator.

41. The system of claim 40 in which said loop includes a summing junction at which said delay signal is applied to the first arriving pulse.

42. The system of claim 41 in which said delay signal is a voltage which modifies a characteristic of one of the edges of the first arriving pulse.

43. The system of claim 42 in which the edge modified is the trailing edge.

44. The system of claim 42 in which the edge modified is the leading edge.

45. The system of claim 10 in which one of said means for generating high frequency signals has a fixed phase, constant pulse rate output, means for applying said fixed phase, constant pulse rate output to one input of said phase comparator, and means for applying the output of the other of said means for generating high frequency digital signals to another input of said phase comparator.

46. The system of claim 45 in which said other means for generating high frequency digital signals comprises a loop including at least two parallel paths each including time-delay means, and switch means responsive to said phase comparator for selectively connecting one or the other of said time-delay means in said loop.

47. The system of claim 10 in which one of said means for generating digital signals comprises a loop including at least two parallel paths each including time-delay means, and switch means responsive to said phase comparator for selectively connecting one or the other of said time-delay means in said loop.

48. The methods of claims 1, 6, 7, 8 or 9 in which said digital function is a single weighted digital function.

49. The system of claims 10 or 12 in which said digital function is a single weighted digital function.

* * * * *

UNITED STATES PATENT AND TRADEMARK OFFICE
CERTIFICATE OF CORRECTION

PATENT NO. : 4,683,456

DATED : July 28, 1987

INVENTOR(S) : Robert G. Nelson

It is certified that error appears in the above-identified patent and that said Letters Patent is hereby corrected as shown below:

```
Column  4, line 61, before "reference" add -- respective --.
Column  5, line  5, "11" should not be in boldface type.
Column  7, line 18 Q, first appearance to -- Q --.
Column 19, line 18, delete "in".
Column 20, line 13, delete "in".
Column 21, line 40, "weighted" should read -- weighed --.
Column 22, line 42, "weighted" should read -- weighed --.
Column 22, line 44, "weighted" should read -- weighed --.
```

Signed and Sealed this

Second Day of February, 1988

Attest:

DONALD J. QUIGG

*Attesting Officer*    *Commissioner of Patents and Trademarks*